US010475520B2

(12) United States Patent
Otterstedt et al.

(10) Patent No.: US 10,475,520 B2
(45) Date of Patent: Nov. 12, 2019

(54) MEMORY CIRCUIT INCLUDING AT LEAST ONE MARKING CELL AND METHOD OF OPERATING SAID MEMORY CIRCUIT

(71) Applicant: Infineon Technologies AG, Neubiberg (DE)

(72) Inventors: Jan Otterstedt, Unterhaching (DE); Robin Boch, Holzkirchen (DE); Gerd Dirscherl, Munich (DE); Bernd Meyer, Munich (DE); Christian Peters, Vaterstetten (DE); Steffen Sonnekalb, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/821,871

(22) Filed: Nov. 24, 2017

(65) Prior Publication Data

US 2018/0151244 A1 May 31, 2018

(30) Foreign Application Priority Data

Nov. 25, 2016 (DE) .......................... 10 2016 122 828

(51) Int. Cl.
| | | |
|---|---|---|
| *G11C 7/22* | (2006.01) | |
| *G11C 29/02* | (2006.01) | |
| *G11C 7/06* | (2006.01) | |
| G11C 29/12 | (2006.01) | |
| G11C 29/00 | (2006.01) | |
| G11C 29/44 | (2006.01) | |

(52) U.S. Cl.
CPC .............. *G11C 29/025* (2013.01); *G11C 7/06* (2013.01); *G11C 29/12005* (2013.01); *G11C 29/702* (2013.01); *G11C 29/82* (2013.01); *G11C 2029/1202* (2013.01); *G11C 2029/4402* (2013.01)

(58) Field of Classification Search
CPC . G11C 29/025; G11C 7/06; G11C 2029/4402; G11C 29/12005; G11C 29/82; G11C 29/702; G11C 2029/1202
USPC ........................................................ 365/189.15
See application file for complete search history.

(56) References Cited

U.S. PATENT DOCUMENTS

| | | | |
|---|---|---|---|
| 2001/0014036 A1* | 8/2001 | Rapp ...................... | G11C 16/22 365/185.04 |
| 2008/0285326 A1 | 11/2008 | Alami et al. | |
| 2012/0030531 A1 | 2/2012 | Brewerton et al. | |

FOREIGN PATENT DOCUMENTS

DE      102011108933 A1     2/2012

* cited by examiner

*Primary Examiner* — Tha-O H Bui
(74) *Attorney, Agent, or Firm* — Viering, Jentschura & Partner MBB

(57) ABSTRACT

A memory circuit includes electrically programmable memory cells arranged in a non-volatile memory cell array along rows and columns, word lines, each word line coupled with one or more memory cells, non-volatile marking memory cells, wherein at least one word line of the word lines is associated with one or more marking memory cells, and marking bit lines, each associated with marking memory cells, marking source lines, each associated with marking memory cells, wherein, for marking memory cells, a physical connection from an associated marking source line and/or from an associated marking bit line to the marking memory cells defines those marking memory cells to a non-changeable state, wherein the marking memory cells are configured to identify the associated word line of respective marking memory cells in the non-changeable memory state.

21 Claims, 9 Drawing Sheets

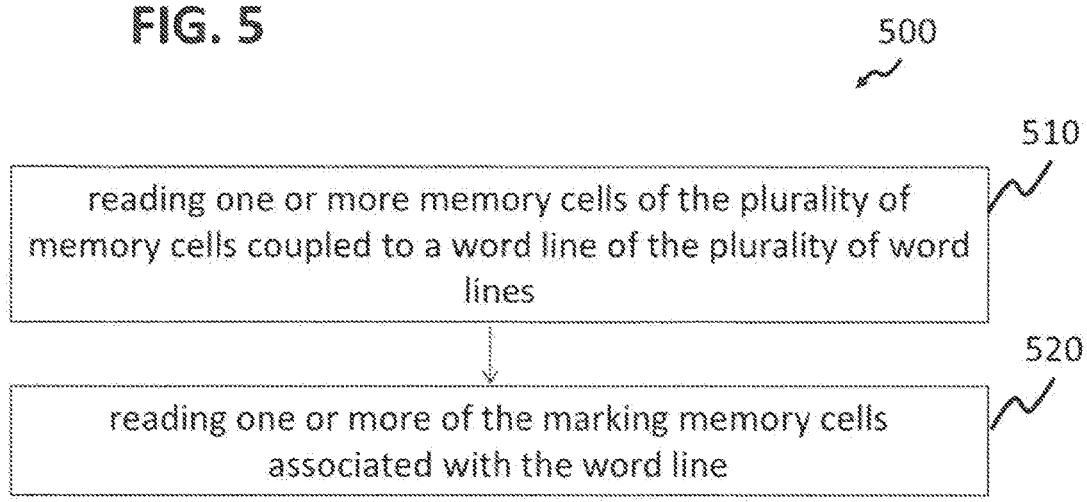

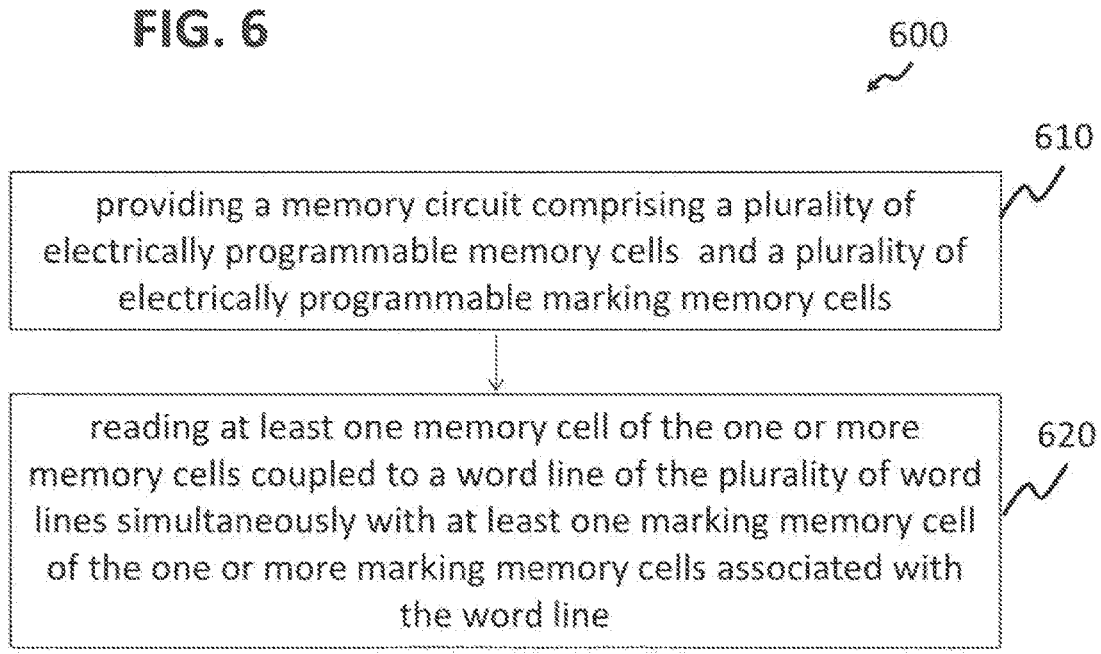

MEMORY CIRCUIT INCLUDING AT LEAST ONE MARKING CELL AND METHOD OF OPERATING SAID MEMORY CIRCUIT

CROSS-REFERENCE TO RELATED APPLICATION

This application claims priority to German Patent Application Serial No. 10 2016 122 828.1, which was filed Nov. 25, 2016, and is incorporated herein by reference in its entirety.

TECHNICAL FIELD

Various embodiments relate generally to a memory circuit and to a method of operating a memory circuit.

BACKGROUND

In a basic typical arrangement, memory cells may be arranged in a matrix fashion, wherein, in one direction, the memory cells may be connected to common word lines, and in an orthogonal direction they may be connected to common bit lines. More hierarchies may be based on this arrangement, but this may be irrelevant here.

An "erase" operation may affect all the memory cells connected to at least one word line, setting all of them to a value defining an unwritten state, e.g., to '1'.

A "write" operation may affect some memory cells connected to one word line, setting them to a value defining a written state, e.g., to '0', wherein the specific memory cells to be written may be selected through the bit lines.

A "read" operation may read out some memory cells connected to one word line, resulting in data consisting of '1's and '0's, wherein the specific memory cells to be read may be selected through the bit lines.

For all of these operations, an address may define which word line and (except for the erase operation) which bit lines are to be operated on.

For an operation of a highly secure memory, it may be essential to be able to reliably verify that the memory operations like erase, write, and read are or have been really performed on the intended memory cells, even in a case of an attacker having physical access to the chip.

This may be difficult to achieve, if one has to assume that the attacker is not only able to manipulate the erase, write, and/or read operations, but also to manipulate the verify operation itself.

In part, this aim may currently be achieved by using an address dependent data encryption. However, by this, not all relevant cases may be covered.

SUMMARY

In various embodiments, a memory circuit is provided. The memory circuit may include a plurality of electrically programmable memory cells arranged in an electrically programmable non-volatile memory cell array along a plurality of rows and a plurality of columns, a plurality of word lines, each word line coupled with one or more memory cells of the plurality of memory cells, a plurality of electrically programmable non-volatile marking memory cells, wherein at least one word line is associated with one or more marking memory cells of the plurality of marking memory cells, and a plurality of marking bit lines, each marking bit line associated with one or more marking memory cells of the plurality of marking memory cells, a plurality of marking source lines, each marking source line associated with one or more marking memory cells of the plurality of marking memory cells, wherein, for one or more marking memory cells of the plurality of marking memory cells, a physical connection from an associated marking source line and/or from an associated marking bit line to the one or more marking memory cells is set to thereby define those one or more marking memory cells to a non-changeable memory state, wherein the plurality of marking memory cells is configured to identify the associated word line of respective one or more marking memory cells in the non-changeable memory state.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5 shows a flow diagram of a method of operating a memory circuit in accordance with various embodiments; and FIG. 6 shows a flow diagram of a method of operating a memory circuit in accordance with various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Herein, for various elements (e.g., memory cells, word lines, bit lines, marking bit lines, etc.) that may occur in pluralities, a common basic reference number may be used, which may, e.g. in the figures and description thereof, be followed by a number for identifying individual elements of the plurality of elements. Even in a case of only the individual identification being used, the identified element is to be understood as being a representative of the basic element.

In various embodiments, a design and operation of a highly secure non-volatile memory (NVM) may be provided. For example, a memory circuit and a method of operating a memory circuit may be provided.

In various embodiments, so-called marker bits may be added to the memory circuit. The marker bits may, in various embodiments, be configured to mark the word lines.

In various embodiments, a capability to simultaneously read from two locations on the word line in the memory array that are not related to the same data word may be provided. This may be referred to as "interleaved reading".

In various embodiments, the marker bits and the interleaved reading may be applied in combination, which makes them extremely powerful to improve security.

In various embodiments, the described principles may in various embodiments easily be applied for other types of memories.

Figure 1A:
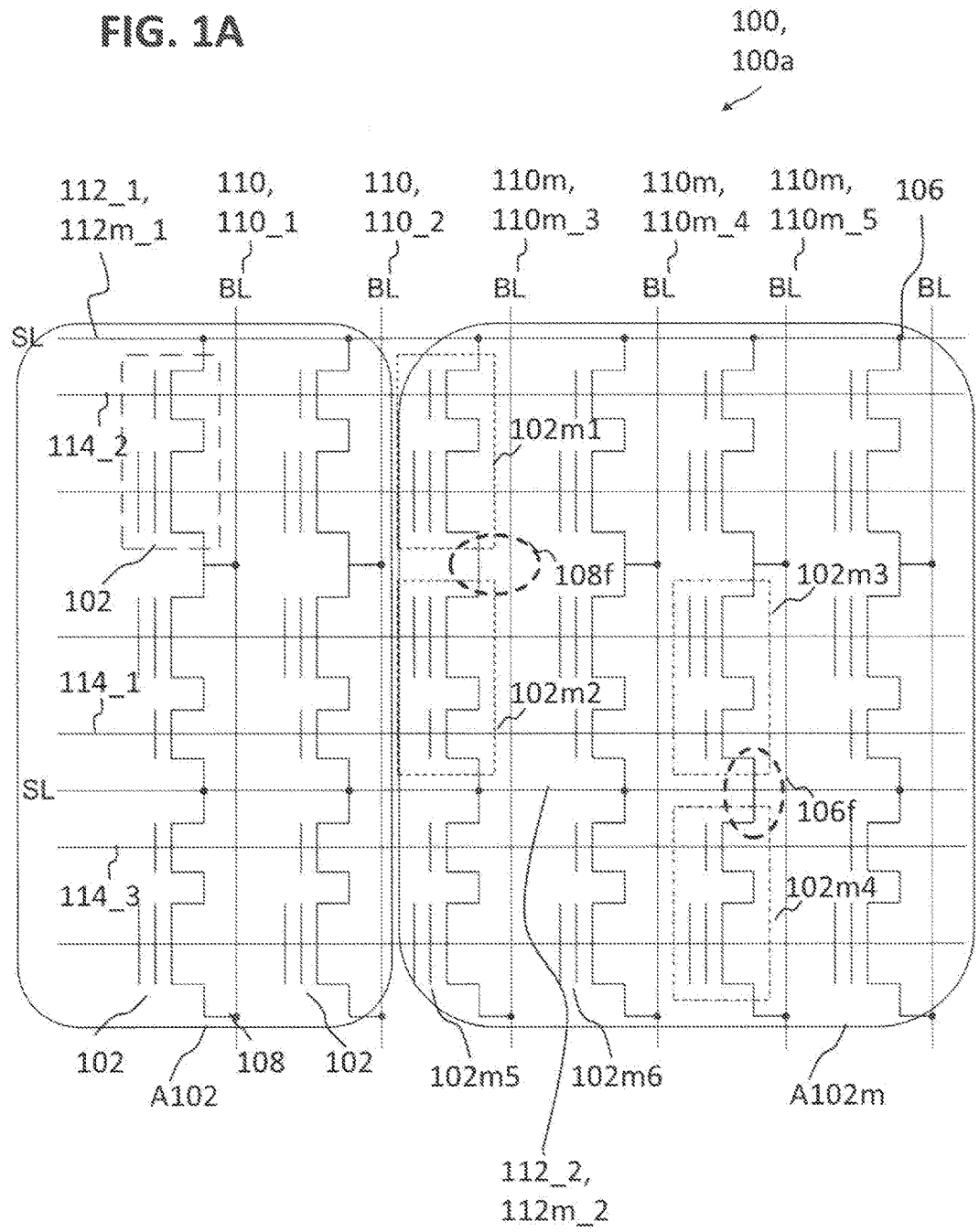
FIGS. 1A and 1B show schematic drawings of memory circuits in accordance with various embodiments.
Figure 1B:
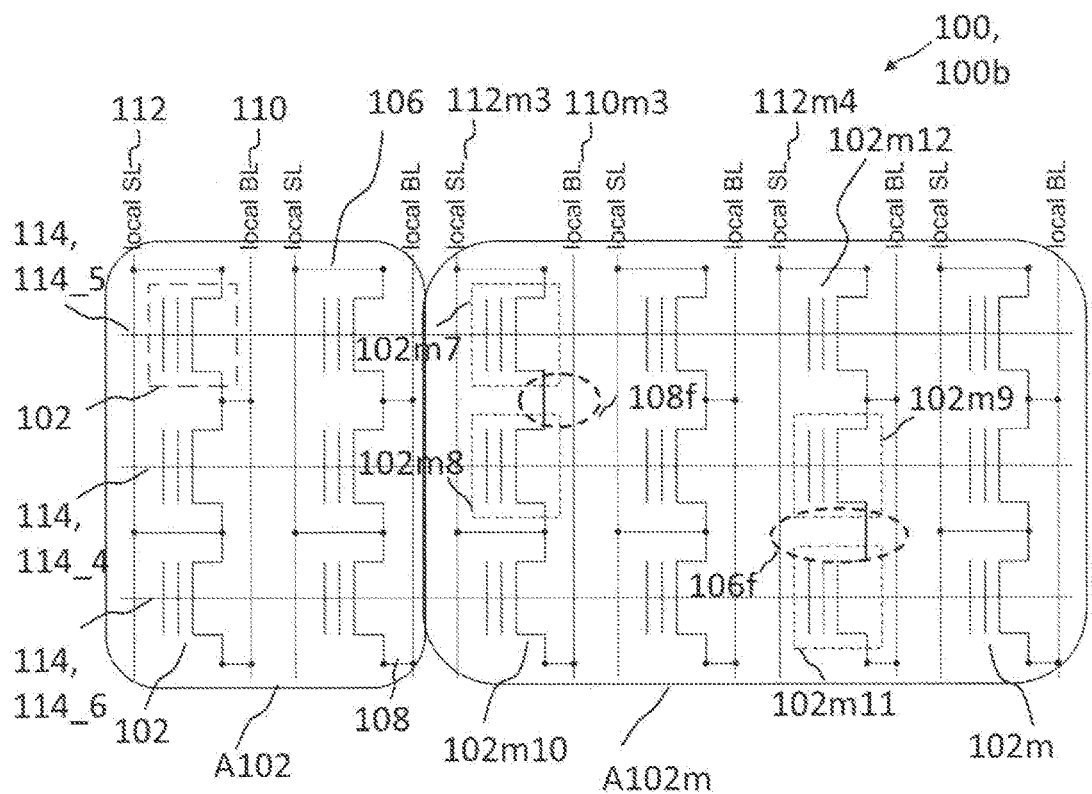
Figure 1C:
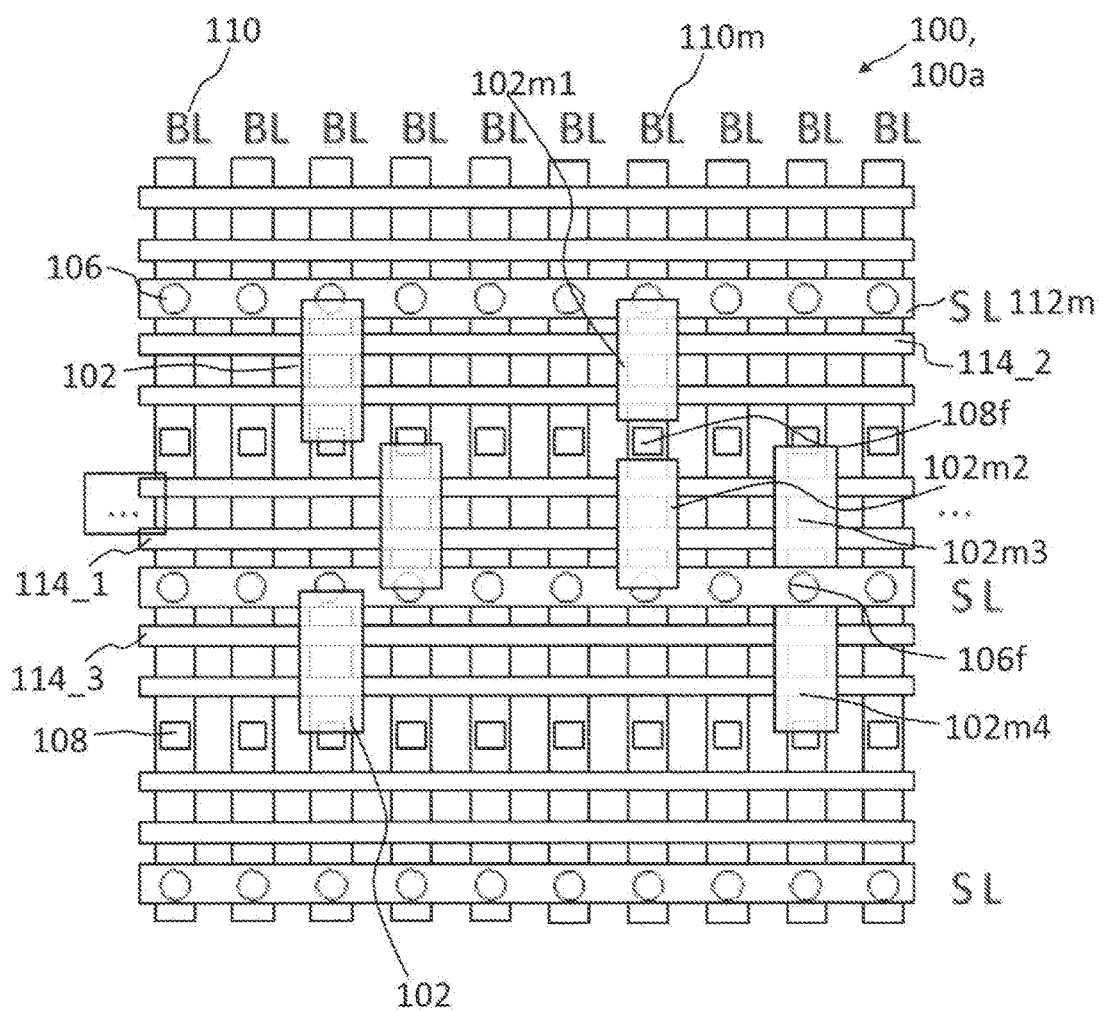
FIG. 1C shows a schematic drawing of the memory circuit of FIG. 1A in accordance with various embodiments.

FIG. 1A and FIG. 1B show schematic drawings of memory circuits 100a, 100b in accordance with various embodiments, and FIG. 1C shows a schematic drawing of the memory circuit 100a of FIG. 1A.

The memory circuits 100a, 100b may, in various embodiments, include a plurality of electrically programmable memory cells 102 arranged in an electrically programmable non-volatile memory cell array A102 along a plurality of rows and a plurality of columns, wherein the memory cell array A102 may have any suitable number of memory cells, rows and columns, respectively. The memory cells 102 may be formed as known in the art. For example, each memory cell 102 may include at least one transistor having a source, a drain, and a gate. The exemplary memory circuit 100a shown in FIG. 1A, which may be based on an HS3P memory array, may for example include two transistors per memory cell, and the exemplary memory circuit 100b shown in FIG. 1B, which may be based on a 1T-UCP memory array, may for example include one transistor per memory cell.

The memory circuits 100a, 100b may, in various embodiments, further include a plurality of word lines 114. Each of the word lines 114 may be coupled, for example as known in the art, with one or more memory cells 102 of the plurality of memory cells 102. For example, each word line 114 may be electrically connected to a gate terminal of each of the respective one or more memory cells 102 that the word line 114 may be coupled with. The memory cells 102 may, in various embodiments, be configured to assume at least two different states. The memory cells 102 may for example be set to and/or switched between two, three, four, or more different states (also referred to as levels). In the following examples, two-level memory cells will be described, and the two levels will be referred to as 1 and 0, respectively, but the described principles are to be understood as being applicable also to three-, four-, or more level memory cells.

In various embodiments, the memory circuits 100a, 100b may include a plurality of electrically programmable non-volatile marking memory cells 102m. Identified in FIG. 1A and FIG. 1B are two of the plurality of marking memory cells as 102m, and four of the marking memory cells that are numbered as 102m1, 102m2, 102m3 and 102m4 for later reference.

In various embodiments, the marking memory cells 102m, as shown in FIG. 1A and FIG. 1B, may form an array A102m of marking memory cells. The marking memory cell array A102m may for example be an extension of the memory cell array A102 or a portion of an original memory cell array that may have been reassigned a functionality of the marking memory cell array A102m. In various embodiments, the marking memory cell array A102m may be separate from the memory cell array A102.

In various embodiments, the plurality of marking memory cells 102m may not be arranged as the marking memory cell array A102m, but may instead be distributed, for example individual memory cells 102 of the memory cell array A102 may be reassigned a functionality of the marking memory cells 102m, and a distribution of the marking memory cells 102m may be known.

In various embodiments, at least one word line 114 of the plurality of word lines 114 may be associated with one or more marking memory cells 102m of the plurality of marking memory cells 102m.

In various embodiments, the at least one word line 114 may be associated with the one or more marking memory cells 102m by being electrically connected to the one or more marking memory cells 102m, e.g. to respective gate terminals of the marking memory cells 102m. In other words, the one or more marking memory cells 102m that may be associated with the at least one word line 114 may lie on the same word line 114 as the plurality of memory cells 102 that may be coupled to the word line. In the exemplary embodiment shown in FIG. 1A, the word line 114_3 may, for example, be coupled with two of the memory cells 102, e.g. the memory cells 102, shown at the bottom of FIG. 1A, and may also be coupled with the marking memory cells 102m4, 102m5, 102m6, and a further marking memory cell shown at the bottom of FIG. 1A.

In various embodiments (not shown), the word line 114 may be associated with the one or more marking memory cells 102m, even though the one or more marking memory cells 102m may not lie on the word line 114, but may instead lie on a different word line. For example, a software or a hardware may be configured to associate the word line 114 with the one or more marking memory cells 102m. For example, the one or more marking memory cells 102m may be electrically connected to a switch, which may be configured to select the word line 114 to which the one or more marking memory cells 102m are associated, in such a way that a selecting of the word line 114 may also select the word line that the one or more marking memory cells 102m are connected to. In another example, the software, e.g. a memory circuit driver software, may be configured to associated the one or more marking memory cells 102m with the word line 114.

In various embodiments, the memory circuits 100a, 100b may include a plurality of marking bit lines 110m, each marking bit line 110m associated with one or more marking memory cells 102m of the plurality of marking memory cells 102m. In various embodiments, the one or more marking memory cells 102m may lie on the marking bit line 110m with which they are associated. In various embodiments, the association between the marking memory cells 102m and the marking bit line 110m may be a spatial association, e.g. the marking memory cell 102m may be associated with the marking bit line 110m to which it is closest. In various embodiments, at least some of the plurality of marking memory cells 102m may be electrically connected to the plurality of marking bit lines 110m, wherein each of the connected marking memory cells 102m may be electrically connected to only one of the marking bit lines 110m, whereas each of the marking bit lines 110m may be connected to none, one, or several of the marking memory cells 102m. In various embodiments, the remaining marking memory cells of the plurality of marking memory cells 102*m* may not be electrically connected (e.g. be electrically disconnected) from the marking bit line 110*m*. The electrically disconnected remaining marking memory cells 102*m* may for example have a contact to the marking bit line 110*m* removed or not formed, or, in various embodiments, the marking memory cell 102*m* itself may not or only partially be formed, wherein the marking memory cell 102*m* may be sufficiently formed that it is addressable by the marking bit line 110*m* and the word line that it may lie on.

In various embodiments, the marking bit lines 110*m* may be different from the bit lines 110 of the memory cell array A102. In various embodiments, for example in a case of the marking memory cells 102*m* being formed within the memory cell array A102, the marking bit lines 110*m* may at least partially include or consist of the bit lines 110.

In various embodiments, the marking bit lines 110*m* and/or the bit lines 110 may have a hierarchical structure including one or more global (marking) bit lines and a plurality of local (marking) bit lines. In FIG. 1B, local marking bit lines 110*m* and local bit lines 110 are shown.

In the exemplary embodiment of FIG. 1A, marking bit line 110*m*_3 may for example be associated with marking memory cells 102*m*1, 102*m*2, and 102*m*5, wherein the local marking bit line 110*m*3 may be electrically connected only to the marking memory cell 102*m*5, and be disconnected from the marking memory cells 102*m*1 and 102*m*2. In the exemplary embodiment of FIG. 1B, the local marking bit line marked with 110*m*3 may for example be associated with marking memory cells 102*m*7, 102*m*8, and 102*m*10, wherein the local marking bit line 110*m*3 may be electrically connected only to the marking memory cell 102*m*10, and be disconnected from the marking memory cells 102*m*7 and 102*m*8.

In various embodiments, the memory circuits 100*a*, 100*b* may include a plurality of marking source lines 112*m*, each marking source line 112*m* associated with one or more marking memory cells 102*m* of the plurality of marking memory cells 102*m*.

In various embodiments, the one or more marking memory cells 102*m* may lie on the marking source line 112*m* with which they are associated. In various embodiments, the association between the marking memory cells 102*m* and the marking source line 112*m* may be a spatial association, e.g. the marking memory cell 102*m* may be associated with the marking source line 112*m* to which it is closest. In various embodiments, at least some of the plurality of marking memory cells 102*m* may be electrically connected to the plurality of marking source line 112*m*, wherein each of the connected marking memory cells 102*m* may be electrically connected to only one of the marking source line 112*m*, whereas each of the marking source lines 112*m* may be connected to none, one, or several of the marking memory cells 102*m*. In various embodiments, the remaining marking memory cells of the plurality of marking memory cells 102*m* may not be electrically connected (e.g. be electrically disconnected) from the marking source line 112*m*. The electrically disconnected remaining marking memory cells 102*m* may for example have a contact to the marking source line 112*m* removed or not formed, or, in various embodiments, the marking memory cell 102*m* itself may not or only partially be formed, wherein the marking memory cell 102*m* may be sufficiently formed that it is addressable by the word line that it may lie on.

In various embodiments, as for example shown in FIG. 1A, the source lines 112 and the word lines 114 may run along the rows of the memory cell array A102—In various embodiments, the marking source lines 112 may run along the rows of the memory cell array A102.

In various embodiments, as for example shown in FIG. 1B, the word lines 114 may run along the rows of the memory cell array A102, while the (local) source lines 112 and the (local) marking source lines 112*m* may run along the columns of the memory cell array A102 and of the marking memory cell array A102*m*, respectively.

In various embodiments, the marking source lines 112*m* may be different from the source lines 112 of the memory cell array A102. In various embodiments, for example in a case of the marking memory cells 102*m* being formed within the memory cell array A102, the marking source lines 112*m* may at least partially include or consist of the source lines 112.

In various embodiments, e.g. as shown in FIG. 1B, the marking source lines 112*m* and/or the source lines 112 may have a hierarchical structure including one or more global (marking) source lines and a plurality of local (marking) source lines. In FIG. 1B, local marking source lines 112*m* and local source lines 112 are shown.

In the exemplary embodiment of FIG. 1A, the marking source line 112*m*2, which may, at the same time, serve as the source line 112_2, may for example be associated with marking memory cells 102*m*4, 102*m*5, 102*m*6, and a further marking memory cell 102*m* (not labelled in FIG. 1A to avoid crowding) shown to the right of the marking memory cell 102*m*4, wherein the marking source line 112*m*2 may be electrically connected to the marking memory cells 102*m*5, 102*m*6 and the further unlabeled marking memory cell, and may be electrically disconnected from the marking memory cell 102*m*4. In the exemplary embodiment of FIG. 1B, the local marking source line 112*m*4 may for example be associated with marking memory cells 102*m*9, 102*m*11, and 102*m*12, wherein the local marking source line 112*m*4 may be electrically connected to the marking memory cell 102*m*12, and may be disconnected from the marking memory cells 102*m*9 and 102*m*11.

In various embodiments, for one or more marking memory cells 102*m* of the plurality of marking memory cells 102*m*, a physical connection 106, 108 from an associated marking source line 112*m* and/or from an associated marking bit line 110*m* to the one or more marking memory cells 102*m* may be set (in this case for example by removing) to thereby define those one or more marking memory cells 102*m* to a non-changeable memory state, wherein the plurality of marking memory cells 102*m* may be configured to identify the associated word line 114 of respective one or more marking memory cells 102*m* in the non-changeable memory state.

In various embodiments, one or more of the plurality of marking memory cells 102*m* may be physically disconnected from bit line 110 and/or from the source line 112 to form a disconnection pattern in an array formed by the plurality of marking memory cells 102*m*.

In various embodiments, as shown in FIG. 1A and FIG. 1B, the setting of the physical connection may include a not-forming or disconnecting of the physical connection. In various embodiments, instead of or in addition to the not-forming or disconnecting of the physical connection, the setting may include an (at least partial) not-forming of the respective marking memory cell 102*m*.

In FIG. 1A, a left-out source line contact is marked as 106*f*. In various embodiments of memory circuits, for example in an HS3P memory device, a single source line connection 106 may be used for connecting two adjacent memory cells 102 to the source line 112. As the marking memory cells 102*m*, normal memory cells of a non-volatile memory device of which the memory circuit 100*a* may be part, may be used. Thus, two adjacent marking memory cells 102*m* may be connected to the marking source line 112*m* by a single source line connection 106. Thus, by not forming, removing or destroying a single source line connection 106 (represented by 106*f*), the two adjacent marking memory cells (in FIG. 1A, those are the marking memory cells 102*m*3 and 102*m*4) may be set. They may be referred to as a marking source line pair or as a source line marker pair. In the exemplary memory circuit 100*a*, the lack of contact in position 106*f* may mean that the marking memory cells 102*m*3, 102*m*4 may never be able to drive a current, and thus may always look written (they may be assigned a bit value of 0).

In FIG. 1A, a left-out bit line contact is marked as 108*f*. In various embodiments of memory circuits, for example in an HS3P memory device, a single bit line connection 108 (also referred to as bit line contact 108) may be used for connecting two adjacent memory cells 102 to the bit line 110, and similarly for connecting two adjacent marking memory cells 102*m* to the marking bit line 110*m*. Thus, two adjacent marking memory cells 102*m* may be connected to the marking bit line 110*m* by a single bit line connection 108. As a consequence, by not forming, removing or destroying a single bit line connection 108 (represented by 108*f*), the two adjacent marking memory cells (in FIG. 1A, those are the marking memory cells 102*m*1 and 102*m*2) may be set. They may also be referred to as a marking bit line pair or as a bit line marker pair. In the exemplary memory circuit 100*a*, the lack of contact in position 108*f* may mean that the marking memory cells 102*m*1, 102*m*2 may never be able to drive a current, and thus may always look written, e.g. they may be assigned a bit value of 0.

In various embodiments, the two adjacent marking memory cells 102*m*3, 102*m*4 that may be affected by the missing source line contact 106*f* may be assigned to two different word lines 114_1, 114_3.

In various embodiments, the two adjacent marking memory cells 102*m*1, 102*m*2 that may be affected by the missing bit line contact 108*f* may be assigned to two different word lines 114_1, 114_2.

In various embodiments, the pair of word lines 114_1, 114_3 to which the marking memory cells 102*m*3, 102*m*4 that may be affected by the missing bit line contact 108*f* may be assigned may be offset by one word line 114 (or, more generally, by an uneven number of word lines 114) from the pair of word lines 114_1, 114_2 to which the marking memory cells 102*m*1, 102*m*2 that may be affected by the missing source line contact 106*f* may be assigned.

In a memory circuit in which, as described above, a single missing contact 108*f*, 106*f* may affect the respective two adjacent marking memory cells 102*m*, removing only one or more source line contact 106 or only one or more bit line contact 108 may not make it possible to provide each word line 114 with a unique arrangement of assigned set marking memory cells 102*m*, because pairs of word lines 114 with identical arrangements of set assigned marking memory cells 102*m* would be created.

However, in various embodiments, a combination of one or more removed source line contacts 106 and one or more removed bit line contacts 108 may be used for providing each word line with a unique arrangement of set marking memory cells 102*m*. In the example shown in FIG. 1A, the pair of marking memory cells 102*m*1, 102*m*2 that may be set by the removed bit line contact 108*f* may be associated with word lines 114_2 and 114_1, respectively. The pair of marking memory cells 102*m*3, 102*m*4 that may be set by the removed source line contact 106*f* may be associated with word lines 114_1 and 114_3, respectively. The offsetting of the two pairs of word lines 114 from each other by one word line 114 may be recognized from the fact that one of the marking memory cells of each pair (in the example, 102*m*2 and 102*m*3) may lie on the common word line 114_1, while the respective other memory cells 102*m*1 and 102*m*4 of the two pairs may lie on word lines 114_2 and 114_3, respectively, which may be different from each other and different from the word line 114_1.

Thereby, in various embodiments, each of the word lines 114_1, 114_2, 114_3 may be associated with a plurality of marking memory cells 102*m* having a unique arrangement of set marking memory cells 102*m*.

In the example of FIG. 1A, only the first marking memory cell 102*m*1 of the four shown marking memory cells 104*m* associated with the word line 114_2 may be set, e.g. set to the "written"-value 0. The other three marking memory cells 102*m* may for example have the "erased"-value of 1; only the first and the third marking memory cells 102*m*2, 102*m*3 of the four shown marking memory cells 104*m* associated with the word line 114_1 may be set, e.g. set to the "written"-value 0. The other two marking memory cells 102*m* may for example have the "erased"-value of 1; and only the third marking memory cell 102*m*4 of the four shown marking memory cells 104*m* associated with the word line 114_3 may be set, e.g. set to the "written"-value 0. The first, second and fourth marking memory cells 102*m* may for example have the "erased"-value of 1. The bit values of the marking memory cells 102*m* may also be referred to as marker bits.

Thus, in various embodiments, by reading the four marking memory cells 102*m* associated with one word line, and determining their respective bit values, which may have a unique sequence for each word line, it may be determined with which word line 114 the read marking memory cells 102*m* may be associated. In other words, the marking memory cells may be configured to allow for an identification of the associated word line. For example, if a string of 0111 is read, the associated word line may be the word line 114_2, if a string of 0101 is read, the associated word line may be the word line 114_1, and if a string of 1101 is read, the associated word line may be the word line 114_3.

In various embodiments, fewer or more than the three word lines 114 shown in FIG. 1A may be identified from their associated marking memory cells 102*m*.

In FIG. 1B, another exemplary embodiment for an arrangement of set marking memory cells 102*m* that may be configured to allow an identification of respective associated word lines 114 is shown. For example, if a string of 0111 is read, the associated word line may be the word line 114_5, if a string of 0101 is read, the associated word line may be the word line 114_4, and if a string of 1101 is read, the associated word line may be the word line 114_6.

In various embodiments, the set value may be assigned the bit value of 1, for example in a case of the memory circuit being part of an RRAM (Restrictive Random Access Memory) device. The set marking memory cells 102*m* may for example have their memory elements replaced by contacts or vias, such that they can always drive a current. The RRAM cell may, in that case, look set, which may be assigned a value of 1.

In the RRAM memory circuit, in accordance with various further embodiments, the marking memory cells 102*m* may be individually set by for example removing or not forming at least some of the bit line contacts 108, or of the source line contacts 106, or by at least partially not forming the respective marking memory cell 102m. The RRAM cell may, in that case, look reset, which may be assigned a value of 0.

In the RRAM memory circuit, by replacing memory elements by contacts or vias or by leaving out bit line contacts 108 or source line contacts, no pairs of adjacent marking memory cells 102m need to be affected. Instead, individual marking memory cells 102m may be set.

The plurality of marking memory cells 102m may, in various embodiments, be configured as a code, which may also be referred to as a marking code or a marker code. A distribution of set marking memory cells 102m amongst the plurality of marking memory cells 102m may be arranged such that a code may be formed that may allow the identification of the respective associated word line 114.

In various embodiments, the marker bits may typically be placed into the memory cell array A102m in such a way that each word line 114 can uniquely be identified by its individual coding.

In various embodiments, additional n memory cells 102m may be added on each word line 114, which may typically be read in parallel to the memory cell array 102 on the word line. In various embodiments, the marking memory cells 102m may form (at least a part of) a marker word M.

In various embodiments, on every word line 114, a different group of out of these additional n marking memory cells may be formed by set marker bits, which may result in every word line having a different value for M, as long as all the normal (in other words, unset) bits in M are erased for a valid identification of the word line (below, an embodiment is described of deliberately setting one or more of the unset marker bits to an invalid bit value).

In various embodiments, due to the pairs of set marking bits 102m being generated by leaving out a contact, no arbitrary values for the word M can be assigned.

One embodiment of a possible coding (out of many) may give a bijective relation between word line address and set marking bit coding: the marking bit pairs may be set such that each word line 114 is associated with a unique sequence of marking bits, taking into account the generated set marking bit pairs. Each sequence of marking bits associated with a word line 114 of the plurality of word lines may be considered as forming a marking word. The marking word may be a word of the code, also referred to as a code word.

The above embodiments having 0 as the set value or having 1 as the set value are to be understood as serving only as a representative example. The set values may, depending on the memory circuit used and on the manipulation performed for setting the memory cell to the unchangeable state, for example be either 0, or 1, or a different value of a multi-valued memory cell.

Figure 2:
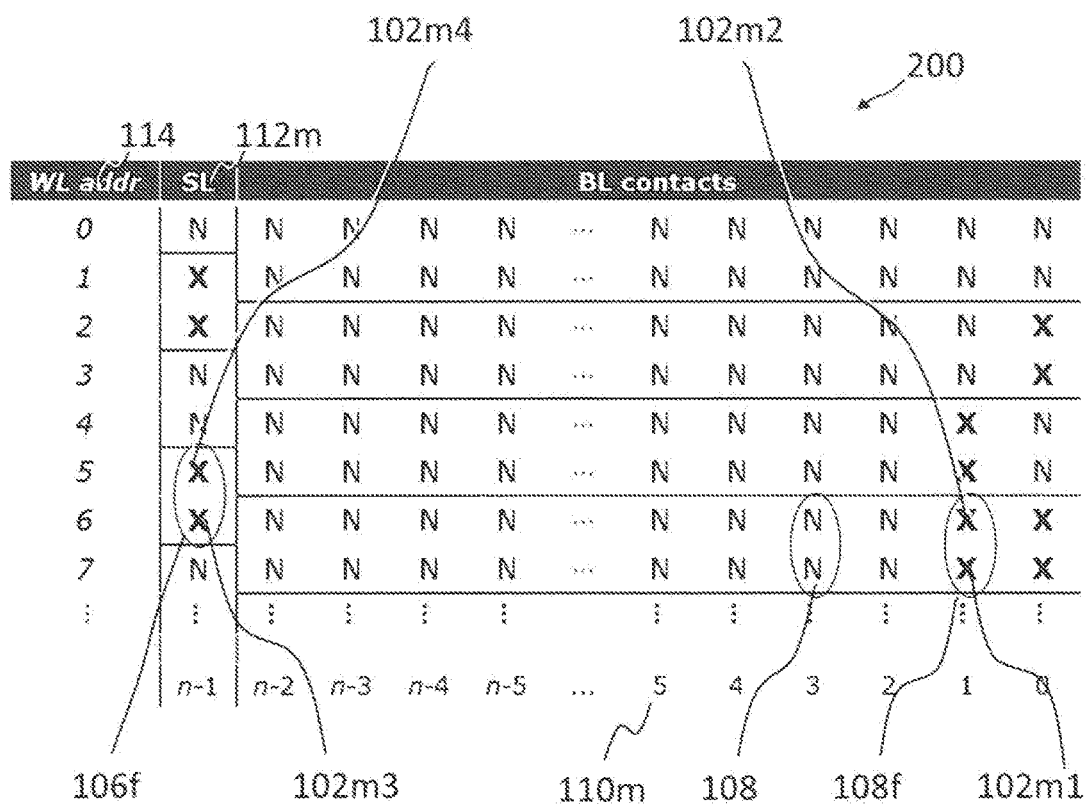
FIG. 2 shows a schematic overview of a distribution of marker bits in a memory circuit in accordance with various embodiments.

FIG. 2 shows a schematic overview of a distribution of marker bits in a memory circuit 200 in accordance with various embodiments In various embodiments, an X may represent a bit value of a set marker bit, which may be read as '0' (written), and an 'N' may represent a "normal" (in other words, unset) bit that may be read as "1" (erased).

In various embodiments, the bit values for each of the word line 114 addresses 0, . . . , 7 and further may form a marking word M (eight marking words are shown).

In various embodiments, bits n−2 . . . 0 of word M may be derived from the word line address (ignoring its least significant bit (LSB)). One or more of the marking memory cells 102m (indicated in FIG. 2 are the marking memory cells 102m1, 102m2), and thus the bits they represent, may be set (also referred to as implemented) by removing BL contacts (indicated as 108f).

In various embodiments, M[n−2] . . . M[0]=addr[n−1] . . . . addr[1], in other words, each of the marking words may include at least a portion of the word line address of the respective word line that the marking word may be associated with. The bit n−1 of word M may be derived from the lowest two bits of the word line address and may be implemented by removing a source line 112 contact: M[n−1]=addr[1] XOR addr[0].

In various embodiments, error detection and/or error correction capability for the words M may be added as known in the art, for example by incorporating parity bit(s) or an ECC coding into the words M.

In various embodiments, two or more codes may be combined to increase a minimum distance (also referred to as hamming distance) of the marker codes. For example, a (10, 5, 3) linear code satisfying all constraints concerning marking of neighbored word lines may be constructed by concatenating a (3, 1, 3) repetition code and a (7, 4, 3) linear code. Let the (7, 4, 3) code be given by the rows {0x0B, 0x15, 0x26, 0x47} of the generator matrix and let [m3, . . . , m0] denote the message bits to be encoded. The repetition code may encode the bit m1 XOR m0, and the (7, 4, 3) code may encodes the bits [m3, . . . , m1]. Then the resulting code word may be a concatenation of the code words. The first code words may be 0x000, 0x380, 0x395, 0x015, 0x026, 0x3A6, . . . .

In various embodiments, a code having a hamming distance of three or more, e.g. four, five, six, or more, may be selected.

Using the marker bits, it may in various embodiments be verified that the memory operations like "erase", "write", "read" really are or have been performed on the intended memory cells 102.

In various embodiments, a correct execution of an erase operation for a word line 114 may be verified after finishing the erase operation itself, by reading out the normal word line content (which should be erased now) and additionally (e.g. sequentially or simultaneously) reading out the marking word M associated to the word line, which may for example lie on this same word line (like shown in FIG. 1A and FIG. 1B). The marking word M should, as shown in the exemplary embodiment of FIG. 2, correspond to the address of the physical word line 114 that was intended to be erased. In other embodiments, in which the code word M may not be the word line address itself, the read code word M should be known to be associated with the targeted word line 114. If one of these two conditions is not fulfilled, a different word line than was intended, or possibly no word line at all, may have been targeted by the erase.

In various embodiments, a correct execution of a write operation for a word line 114 may be verified after finishing the write operation itself, by reading out the normal word line content (which should match to the written data now), and additionally (e.g. sequentially or simultaneously) reading out the marking word M associated to the word line, which may for example lie on this same word line (like shown in FIG. 1A and FIG. 1B). The read marking word M should, as shown in the exemplary embodiment of FIG. 2, correspond to the address of the physical word line that was intended to be written. In other embodiments, in which the code word M may not be the word line address itself, the code marking word M should be known to be associated with the targeted word line 114. If one of these two conditions is not fulfilled, a different word line than was intended, or possibly no word line at all, may have been targeted by the write.

In various embodiments, a correct execution of a read operation for a word line may be verified by not only reading out the normal word line 114 content (which may be the requested data), but additionally reading out the marking word M associated with the word line the data comes from. The read marking word M should, as shown in the exemplary embodiment of FIG. 2, correspond to the address of the physical word line that was intended to be written. In other embodiments, in which the code word M may not be the word line address itself, the code marking word M should be known to be associated with the targeted word line 114. If one of these two conditions is not fulfilled, a different word line than was intended, or possibly no word line at all, may have been targeted by the read.

In various embodiments, since the "normal" bits in word M may be written like all normal memory cells, a word line may intentionally be marked as invalid by writing at least a portion of the marking word M to a value that is invalid, e.g. to all-'0', so that the above described check of M surely fails, until the word line 114 is erased again.

This functionality may for example be used for deactivating word lines. As an example, in a memory device used for payment, having an amount to be spent stored as data content in a word line, after a spending of the amount, instead of erasing the word line, which may be a relatively time consuming process, one or more bits of the (as yet unset and thus writable) associated marking word may be written, which will cause a future verification of a read process to fail. Thereby, the spent amount may have been invalidated using a write process, which may be faster than the erase process.

In various embodiments, the above described usage of the marking words may secure a memory circuit from a rather static manipulation.

Figure 3A:
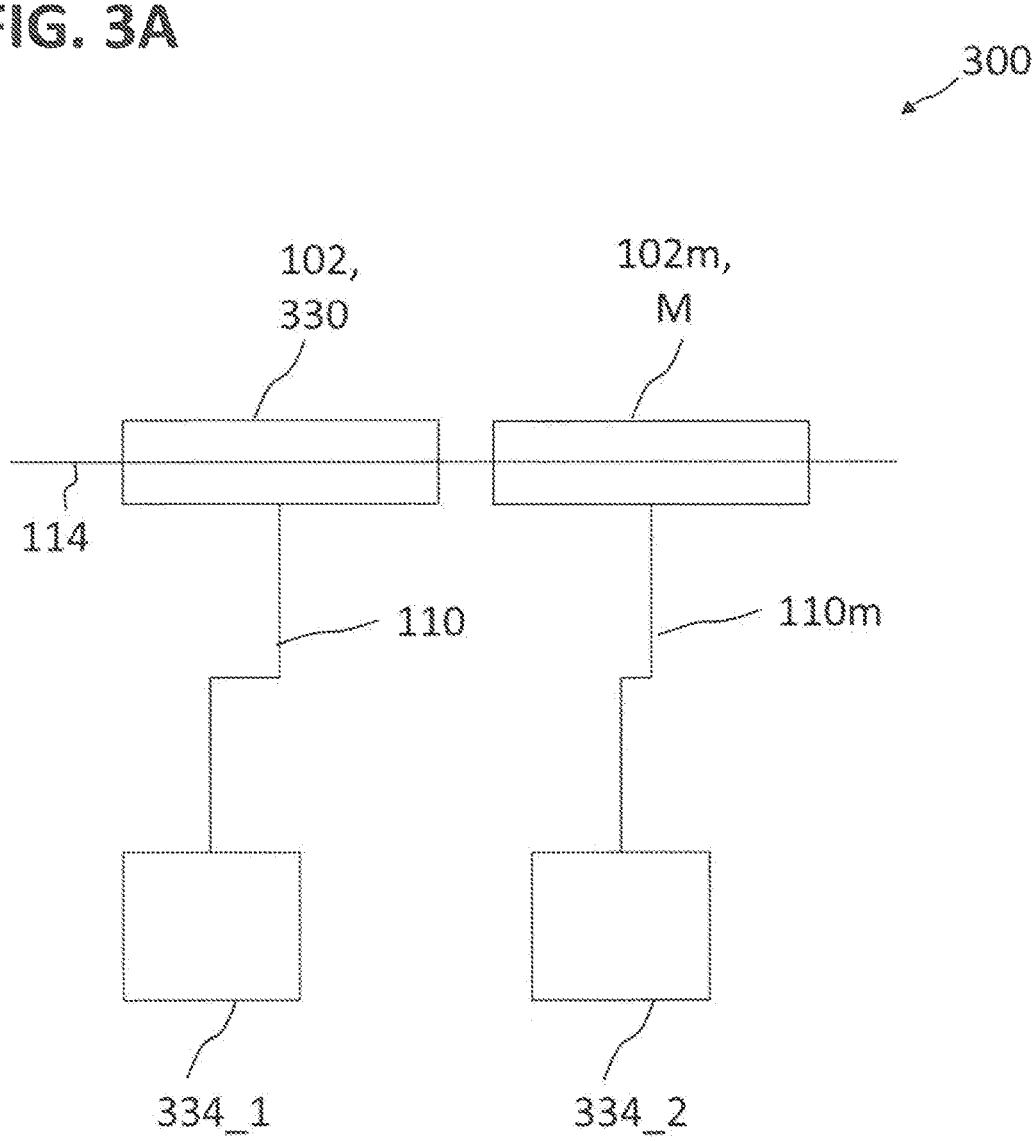
FIG. 3A and FIG. 3B each show a schematic drawing of a portion of respective memory circuits in accordance with various embodiments.
Figure 3B:
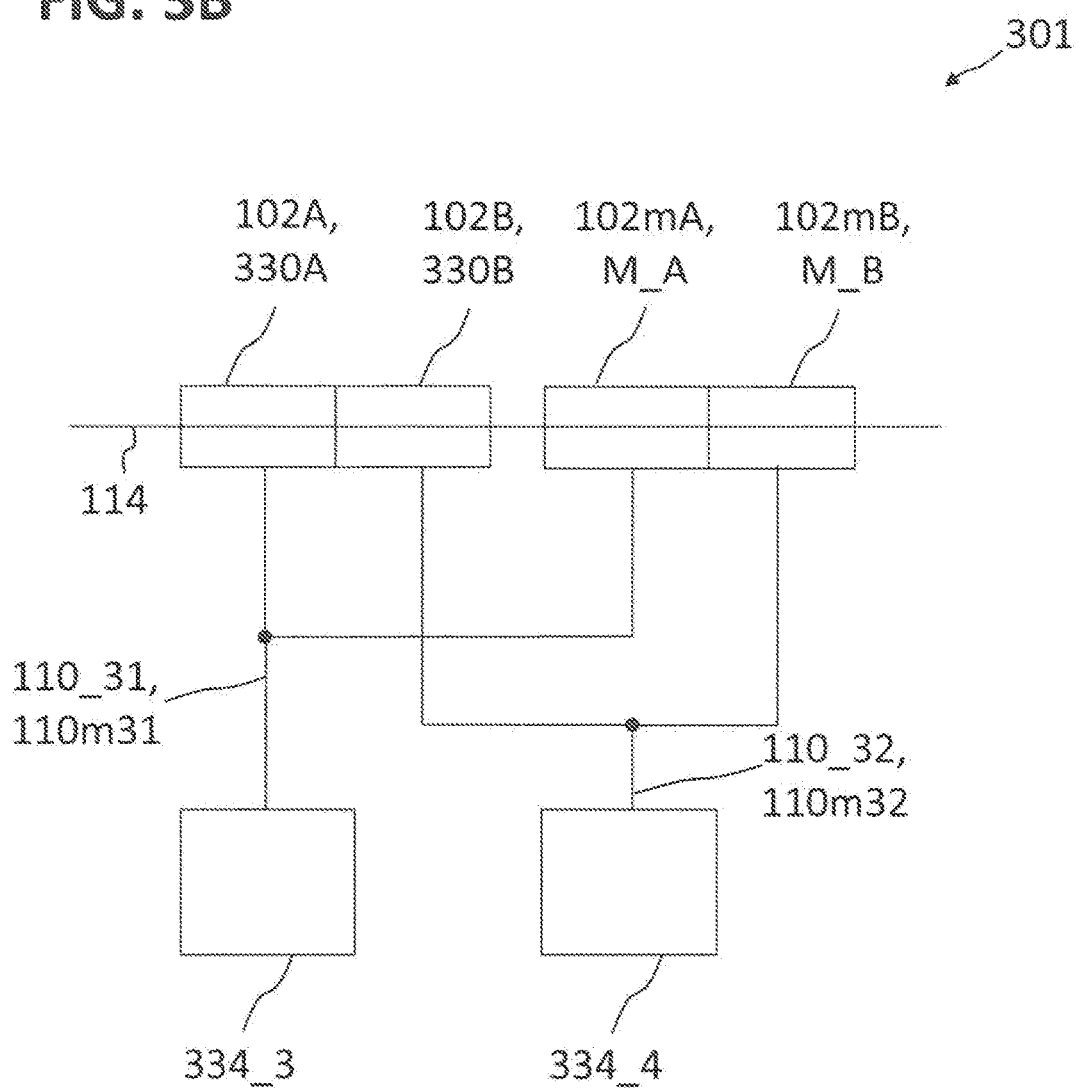

FIG. 3A and FIG. 3B each show a schematic drawing of a portion of respective memory circuits 300 and 301, respectively, in accordance with various embodiments. Except for the differences described below, the memory circuits 300, 301 may be similar or identical to the memory circuits described above. In various embodiments, the memory circuits 300, 301 may be used as described above for the memory circuits 100a, 100b, and 200.

If an attacker has an ability to dynamically adapt his attack, a process that may be referred to as "interleaved reading" defeats him. Interleaved reading may, in various embodiments, provide a capability to simultaneously read from two locations on a word line that may not be related to the same data word.

In various embodiments, of which an exemplary example is schematically shown in FIG. 3A, this may be achieved by adding additional reading circuitry that, in addition to reading a data word 330, which may be stored in memory cells 102, at the same time may be able to read a marker word M, for example as described above, of the addressed word line, which may be stored in marking memory cells 102m. In this way, by simultaneously reading the data word 330 and the associated marker word, which may be configured to identify the word line 114, it may be ensured that the data word 330 and the marker word M are really read from the same word line 114, and furthermore it may be ensured that the same word line is the addressed word line 114.

In various embodiments, for allowing the simultaneous read of the data word 330 and of the marker word M, additional read circuitry, e.g. the marking memory cells 102m, an additional marking bit line 110m, and an additional sense amplifier 334_2 may be required, e.g. in addition to the memory cells 102, a bit line 110 and a sense amplifier 334_1.

The additional read circuitry may require additional area on a chip. Such a requirement may be strongly reduced for the following various embodiments, of which a representative example is schematically shown in FIG. 3B.

In various embodiments, no or only little additional read circuitry, which may for example require little or no additional chip area, may be provided, which may just add to an existing read circuitry, e.g. as known in the art, an ability to partially read from different addresses on the same addressed word line 114.

In various embodiments, the read circuitry of the memory circuit 301 may be divided into at least two portions. For easy understanding of the concept, an embodiment with two portions is shown in FIG. 3B and described, but in various embodiments, three or more portions may be used in a similar way.

In FIG. 3B, the first read circuitry portion may include a first memory cell portion 102A, in which a first data word portion 330A may be stored, a first marking memory cell portion 102mA, in which a first portion M_A of the marking word M may be stored, a first bit line/marking bit line 110_31, 110m31, and a first sense amplifier 334_3. The second read circuitry portion may include a second memory cell portion 102B, in which a second data word portion 330B may be stored, a second marking memory cell portion 102mB, in which a second portion M_B of the marking word M may be stored, a second bit line/marking bit line 110_32, 110m32, and a second sense amplifier 334_4.

In various embodiments, each portion may have the ability to read either from the normal data word 330 or from the marker word M.

In the exemplary embodiment of FIG. 3B, for illustrative purposes only and without limiting the various embodiments thereto, the marking word M and the normal data word may each have a width n, and the two portions may be assigned to consecutive bits of the data word.

Portion 330A may include bits m−1 down to 0, and portion 330B may include bits n−1 down to m, with m<n. As a typical choice that may be best for security, m may be selected as follows:

$m = n/2$ (for even $n$)

$m = (n-1)/2$ or $m = (n+1)/2$ (for odd $n$)

A normal read operation may be performed with both read portions targeting either a normal data word 330A, 330B or a marker word M_A, M_B.

A secured (interleaved) read operation may include or consist of two interleaved read operations, performed in arbitrary order:

1) The first read portion of a first read process targeting the first portion 330A of the normal data word 330, yielding D[m−1 . . . 0], and the second read portion of the first read process targeting the second portion M_B of the marking word M, yielding M[n−1 . . . m]

2) The first read portion of a further read process targeting the second portion 330B of the normal data word 330, yielding D[n−1 . . . m] and the second read portion of the second read process targeting the first portion M_A of the marking word M, yielding M[m−1 . . . 0].

Together, the read operations 1) and 2) may yield the full normal data word 330 and the full marker word M that may contain the marker bits, which may now be checked for consistency as described above.

Figure 4:
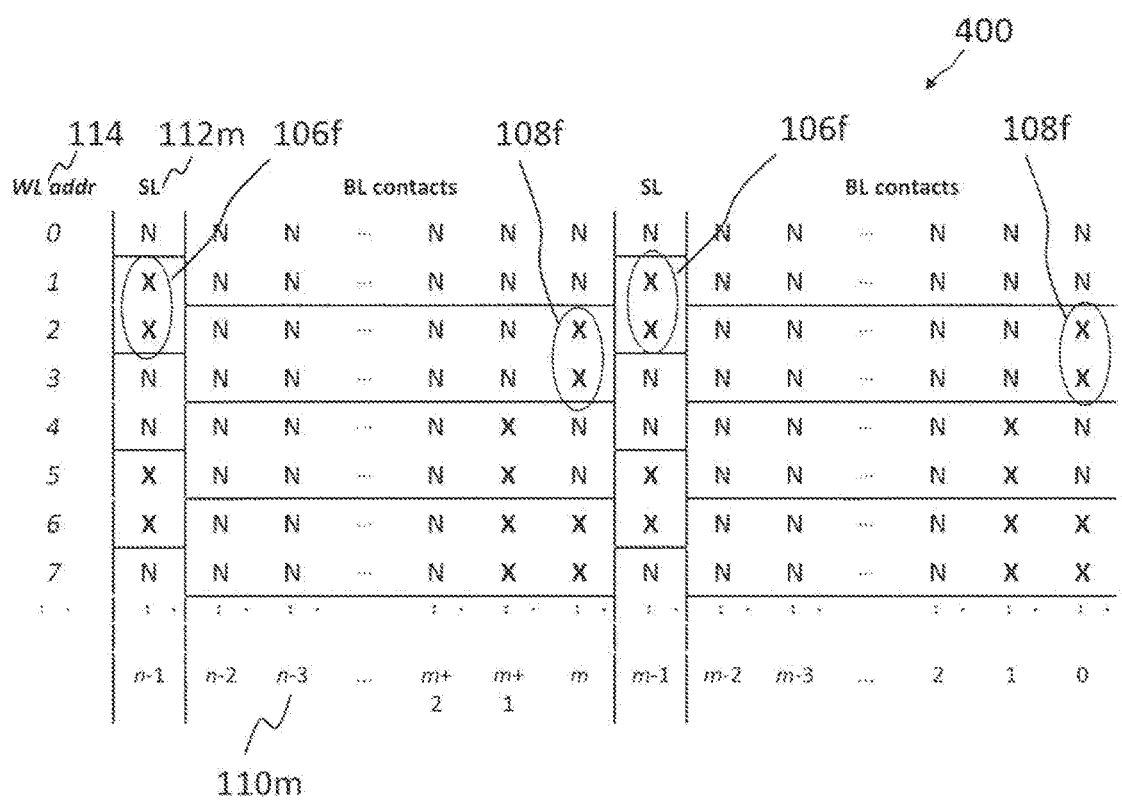
FIG. 4 shows a schematic overview of a distribution of marker bits in a memory circuit in accordance with various embodiments.

In various embodiments, for the interleaved reading, since the read operations 1) and 2) read interleaved, it may not be possible that the data word 330 and the marking word M come from different word lines, but at most can be mixed from two different word lines, which may be detected by a suitable coding for M, e.g. two times containing the address information, once in M[m−1 . . . 0] and once in M[n−1 . . . m], for example as shown in FIG. 4.

In various embodiments, more than one marking word M may be included per word line 114.

In various embodiments, for the interleaved reading, the set marker bits, which may be configured to identify an associated word line of the plurality of word lines, may be set to the non-changeable memory state as described above. In various embodiments, for the interleaved reading, the set marker bits may not be set to a non-changeable memory state, but may instead be normally written memory bits, which may nevertheless be configured to identify the associated word line of the plurality of word lines, for example by including the word line address, or a different code for identifying the associated word line 114.

In various embodiments, the interleaved reading may not require a dedicated coding using marker bits, and even no special, additional word M may be necessary.

In an exemplary embodiment, the read circuitry may be divided into x portions.

Each portion may have the ability to read from one out of x words addressed independently on the same word line 114.

In various embodiments, x read operations may be performed, wherein each of the read portions may be simultaneously reading its portion from a different of the x words, and where, after all x read operations have been performed, each read portion has read its portion from all x different words, such that a full interleaved reading of all x words may have been performed.

A consistency check of the data may certify that the words have consistently been read from the same word line 114. This check may for example include or consist of checking an error detection code or checking that one of the words codes for the correct word line address. In the latter case, the embodiment may be similar to the various embodiments described above, but using normal programmed data (e.g., known data) instead of marking words.

In various embodiments, the memory circuit for executing the interleaved reading and/or for using the marker bits, e.g. the set marker bits, and/or for checking for a correct execution of a write or a read operation may be at least one of a group of memory circuits, the group including all types of non volatile memory circuits, e.g. RRAM, CBRAM, PCRAM, MRAM, flash memory (like UCP, HS3P, nano crystals, MONOS, ETOX, SST, SONOS, DiNOR), EEPROM, etc. The memory circuit(s) may in various embodiments be included in a memory device, for example an SSD, embedded NVM, stand-alone memory device (like, e.g., a memory stick), and the like.

In various embodiments, the memory circuit for executing the check for a correct execution of an erase operation may be at least one of a group of non-volatile memory circuits that may provide a dedicated erase operation targeting an erase of a word line at a time, the group including flash memory (like UCP, HS3P, nano crystals, MONOS, ETOX, SST, SONOS, DiNOR), etc. The memory circuit(s) may in various embodiments be included in a memory device, for example an SSD, embedded NVM, stand-alone memory device (like, e.g., a memory stick), and the like.

In various embodiments, the memory circuit having the marker bits and/or executing the interleaved reading, and/or the checking for the correct execution of operations (read, write) may be included in other types of memories, e.g. RAM (SRAM, DRAM), and the like.

FIG. 5 shows a flow diagram 500 of a method of operating a memory circuit in accordance with various embodiments.

For the method of operating a memory circuit, a memory circuit as described above may be used.

In various embodiments, the method may include reading one or more memory cells of the plurality of memory cells coupled to a word line of the plurality of word lines (in 510), and reading one or more of the marking memory cells associated with the word line (in 520).

FIG. 6 shows a flow diagram of a method of operating a memory circuit in accordance with various embodiments.

For the method of operating a memory circuit, a memory circuit as described above may be used.

In various embodiments, the method may include providing a memory circuit comprising a plurality of electrically programmable memory cells and a plurality of electrically programmable marking memory cells (in 610), and reading at least one memory cell of the one or more memory cells coupled to a word line of the plurality of word lines simultaneously with at least one marking memory cell of the one or more marking memory cells associated with the word line (in 620).

In various embodiments, a memory circuit is provided. The memory circuit may include a plurality of electrically programmable memory cells arranged in an electrically programmable non-volatile memory cell array along a plurality of rows and a plurality of columns, a plurality of word lines, each word line coupled with one or more memory cells of the plurality of memory cells, a plurality of electrically programmable non-volatile marking memory cells, wherein at least one word line of the plurality of word lines is associated with one or more marking memory cells of the plurality of marking memory cells, and a plurality of marking bit lines, each marking bit line associated with one or more marking memory cells of the plurality of marking memory cells, a plurality of marking source lines, each marking source line associated with one or more marking memory cells of the plurality of marking memory cells, wherein, for one or more marking memory cells in the marking memory cell array, a physical connection from an associated marking source line and/or from an associated marking bit line to the one or more marking memory cells is set to thereby define those one or more marking memory cells to a non-changeable memory state, wherein the marking memory cells configured to identify the associated word line of respective one or more marking memory cells in the non-changeable memory state.

In various embodiments, the marking memory cells may form a code configured to identify the associated word line of respective one or more marking memory cells in the non-changeable memory state.

In various embodiments, the code may include at least one of a group of codes, the group including a linear code and a repetition code.

In various embodiments, the set physical connection from an associated marking source line and/or from an associated marking bit line to the one or more marking memory cells may be a disconnected physical connection from an associated marking source line and/or from an associated marking bit line to the one or more marking memory cells.

In various embodiments, each of the unconnected physical connections from an associated marking source line and/or from an associated marking bit line to the one or more marking memory cells may be configured to disconnect a pair of two adjacent memory cells associated with a pair of adjacent word lines.

In various embodiments, the one or more marking memory cells may include a first pair of two adjacent memory cells associated with a first pair of adjacent word lines, and a second pair of two adjacent memory cells, wherein one memory cell of the second pair is associated with one word line of the first pair of adjacent word lines, whereas the other memory cell of the second pair is associated with a word line that is different from the first pair of associated word lines.

In various embodiments, the memory circuit may be configured to read one or more memory cells coupled to a word line of the plurality of word lines simultaneously with one or more of the marking memory cells associated with the word line.

In various embodiments, the memory circuit may further include a plurality of sense amplifiers, wherein the one or more memory cells coupled to a word line may be coupled to a first sense amplifier of the plurality of sense amplifiers, while the one or more of the marking memory cells associated with the word line may be coupled to a further sense amplifier of the plurality of sense amplifiers.

In various embodiments, a method of operating the memory circuit in accordance with various embodiments may be provided, wherein the method may include reading one or more memory cells of the plurality of memory cells coupled to a word line of the plurality of word lines, and reading one or more of the marking memory cells associated with the word line.

In various embodiments, the reading one or more memory cells and the reading one or more of the marking memory cells may be executed simultaneously.

In various embodiments, the method may further include, before the reading one or more memory cells and before the reading one or more of the marking memory cells, writing to the one or more memory cells.

In various embodiments, the method may further include, before the reading one or more memory cells and before the reading one or more of the marking memory cells, erasing the one or more memory cells.

In various embodiments, the method may further include, after the reading one or more memory cells and after the reading one or more of the marking memory cells, checking that data read from the memory cells originate from the one or more memory cells coupled to the word line using information read from the marking memory cells and the code.

In various embodiments, the method may further include writing to at least one of the marking memory cells except the set memory cells, thereby invalidating a data content of the associated word line.

In various embodiments, a memory circuit may be provided. The memory circuit may include a plurality of electrically programmable memory cells arranged in an electrically programmable non-volatile memory cell array along a plurality of rows and a plurality of columns, a plurality of word lines, each word line coupled with one or more memory cells of the plurality of memory cells, and a plurality of electrically programmable non-volatile marking memory cells, wherein each word line is associated with one or more marking memory cells of the plurality of marking memory cells, wherein one or more marking memory cells in the marking memory cell array are in a known memory state, wherein the marking memory cells form a code configured to identify the associated word line of respective one or more marking memory cells in the non-changeable memory state, and wherein the memory circuit is configured to read, for each of the word lines, at least one memory cell of the one or more memory cells simultaneously with at least one marking memory cell of the one or more marking memory cells.

In various embodiments, the at least one memory cell may include a data portion of the at least one memory cell and a further data portion of the at least one memory cell, wherein the at least one marking memory cell may include a marking portion of the at least one marking memory cell and a further marking portion of the at least one marking memory cell, wherein the memory circuit may be configured to read, for each of the word lines, the data portion simultaneously with the further marking portion, and to read the further data portion simultaneously with the marking portion.

In various embodiments, the memory device may further include at least two sense amplifiers, wherein a first sense amplifier of the at least two sense amplifiers is connected to the at least one memory cell and a second sense amplifier of the at least two sense amplifiers is connected to the at least one marking memory cell.

In various embodiments, the method may further include at least two sense amplifiers, wherein a first sense amplifier of the at least two sense amplifiers may be connected to the data portion and to the marking portion, and a second sense amplifier of the at least two sense amplifiers may be connected to the further data portion and to the further marking portion.

In various embodiments, at least a portion of the one or more marking memory cells in the marking memory cell array that are in a known memory state may include yet another data portion having known data.

In various embodiments, at least one marking memory cell of the one or more marking memory cells in the marking memory cell array that are in a known memory state may be in a non-changeable memory state.

In various embodiments, a method of operating a memory circuit in accordance with various embodiments may be provided. The method may include: reading at least one memory cell of the one or more memory cells coupled to a word line of the plurality of word lines simultaneously with at least one marking memory cell of the one or more marking memory cells associated with the word line.

In various embodiments, the method may further include, before the reading one or more memory cells and before the reading one or more of the marking memory cells, writing to the one or more memory cells.

In various embodiments, the method may further include, before the reading one or more memory cells and before the reading one or more of the marking memory cells, erasing the one or more memory cells.

In various embodiments, the method may further include, after the reading one or more memory cells and after the reading one or more of the marking memory cells, checking that data read from the memory cells originate from the one or more memory cells coupled to the word line using information read from the marking memory cells and the code.

Various embodiments have been described in context with a device, and various embodiments have been described in context with a method. Further embodiments of the device may be given by the description of the method, and vice versa.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A memory circuit, comprising:
a plurality of electrically programmable memory cells arranged in an electrically programmable non-volatile memory cell array along a plurality of rows and a plurality of columns;
a plurality of word lines, each word line coupled with one or more memory cells of the plurality of memory cells;
a plurality of electrically programmable non-volatile marking memory cells;
wherein at least one word line of the plurality of word lines is associated with one or more marking memory cells of the plurality of marking memory cells; and
a plurality of marking bit lines, each marking bit line associated with one or more marking memory cells of the plurality of marking memory cells;
a plurality of marking source lines, each marking source line associated with one or more marking memory cells of the plurality of marking memory cells;
wherein, for one or more marking memory cells of the plurality of marking memory cells, a physical connection from an associated marking source line and/or from an associated marking bit line to the one or more marking memory cells sets the one or more marking memory cells to a non-changeable memory state, wherein the plurality of marking memory cells is configured to identify the associated word line of respective one or more marking memory cells in the non-changeable memory state,
wherein the physical connection from an associated marking source line and/or from an associated marking bit line to the one or more marking memory cells that sets the one or more marking memory cells to a non-changeable memory state is a disconnected physical connection from an associated marking source line and/or from an associated marking bit line to the one or more marking memory cells.

2. The memory circuit of claim 1,
wherein the marking memory cells form a code configured to identify the associated word line of respective one or more marking memory cells in the non-changeable memory state.

3. The memory circuit of claim 1,
wherein each of the disconnected physical connections from an associated marking source line and/or from an associated marking bit line to the one or more marking memory cells is configured to disconnect a pair of two adjacent memory cells associated with a pair of adjacent word lines.

4. The memory circuit of claim 3,
wherein the one or more marking memory cells comprises a first pair of two adjacent memory cells associated with a first pair of adjacent word lines, and a second pair of two adjacent memory cells, wherein one memory cell of the second pair is associated with one word line of the first pair of adjacent word lines, whereas the other memory cell of the second pair is associated with a word line that is different from the first pair of adjacent word lines.

5. The memory circuit of claim 1,
wherein the memory circuit is configured to read one or more memory cells coupled to a word line of the plurality of word lines simultaneously with one or more of the marking memory cells associated with the word line.

6. The memory circuit of claim 1, further comprising:
a plurality of sense amplifiers,
wherein the one or more memory cells coupled to a word line are coupled to a first sense amplifier of the plurality of sense amplifiers, while the one or more of the marking memory cells associated with the word line are coupled to a further sense amplifier of the plurality of sense amplifiers.

7. A memory circuit, comprising:
a plurality of electrically programmable memory cells arranged in an electrically programmable non-volatile memory cell array along a plurality of rows and a plurality of columns;
a plurality of word lines, each word line coupled with one or more memory cells of the plurality of memory cells;
a plurality of electrically programmable non-volatile marking memory cells;
wherein each word line is associated with one or more marking memory cells of the plurality of marking memory cells;
wherein one or more marking memory cells in the marking memory cell array are in a known memory state, wherein the marking memory cells form a code configured to identify the associated word line of respective one or more marking memory cells in the known memory state, and
wherein the memory circuit is configured to read, for each of the word lines, at least one memory cell of the one or more memory cells simultaneously with at least one marking memory cell of the one or more marking memory cells.

8. The memory circuit of claim 7,
wherein the at least one memory cell comprises a data portion of the at least one memory cell and a further data portion of the at least one memory cell;
wherein the at least one marking memory cell comprises a marking portion of the at least one marking memory cell and a further marking portion of the at least one marking memory cell;
wherein the memory circuit is configured to read, for each of the word lines, the data portion simultaneously with the further marking portion, and to read the further data portion simultaneously with the marking portion.

9. The memory circuit of claim 8, further comprising:
at least two sense amplifiers, wherein a first sense amplifier of the at least two sense amplifiers is connected to the data portion and to the marking portion, and a second sense amplifier of the at least two sense amplifiers is connected to the further data portion and to the further marking portion.

10. The memory circuit of claim 7, further comprising:
at least two sense amplifiers, wherein a first sense amplifier of the at least two sense amplifiers is connected to the at least one memory cell and a second sense amplifier of the at least two sense amplifiers is connected to the at least one marking memory cell.

11. The memory circuit of claim 7,
wherein at least one marking memory cell of the one or more marking memory cells in the marking memory cell array that are in a known memory state is in a non-changeable memory state.

12. A method of operating a memory circuit comprising, the memory circuit comprising:
- a plurality of electrically programmable memory cells arranged in an electrically programmable non-volatile memory cell array along a plurality of rows and a plurality of columns;
- a plurality of word lines, each word line coupled with one or more memory cells of the plurality of memory cells;
- a plurality of electrically programmable non-volatile marking memory cells;
- wherein at least one word line of the plurality of word lines is associated with one or more marking memory cells of the plurality of marking memory cells; and
- a plurality of marking bit lines, each marking bit line associated with one or more marking memory cells of the plurality of marking memory cells;
- a plurality of marking source lines, each marking source line associated with one or more marking memory cells of the plurality of marking memory cells;
- wherein, for one or more marking memory cells of the plurality of marking memory cells, a physical connection from an associated marking source line and/or from an associated marking bit line to the one or more marking memory cells sets the one or more marking memory cells to a non-changeable memory state, wherein the plurality of marking memory cells is configured to identify the associated word line of respective one or more marking memory cells in the non-changeable memory state, and
- wherein the marking memory cells form a code configured to identify the associated word line of respective one or more marking memory cells in the non-changeable memory state, and
- wherein the physical connection from an associated marking source line and/or from an associated marking bit line to the one or more marking memory cells that sets the one or more marking memory cells to a non-changeable memory state is a disconnected physical connection from an associated marking source line and/or from an associated marking bit line to the one or more marking memory cells wherein the method comprises:
- reading one or more memory cells of the plurality of memory cells coupled to a word line of the plurality of word lines; and
- reading one or more of the marking memory cells associated with the word line.

13. The method of claim 12,
wherein the reading one or more memory cells and the reading one or more of the marking memory cells is executed simultaneously.

14. The method of claim 12, further comprising:
before the reading one or more memory cells and before the reading one or more of the marking memory cells, writing to the one or more memory cells.

15. The method of claim 12, further comprising:
before the reading one or more memory cells and before the reading one or more of the marking memory cells, erasing the one or more memory cells.

16. The method of claim 12, further comprising:
after the reading one or more memory cells and after the reading one or more of the marking memory cells, checking that data read from the memory cells originate from the one or more memory cells coupled to the word line using information read from the marking memory cells and the code.

17. The method of claim 12, further comprising:
writing to at least one of the marking memory cells except the set marking memory cells, thereby invalidating a data content of the associated word line.

18. A method of operating a memory circuit, the memory circuit comprising:
- a plurality of electrically programmable memory cells arranged in an electrically programmable non-volatile memory cell array along a plurality of rows and a plurality of columns;
- a plurality of word lines, each word line coupled with one or more memory cells of the plurality of memory cells;
- a plurality of electrically programmable non-volatile marking memory cells;
- wherein each word line is associated with one or more marking memory cells of the plurality of marking memory cells;
- wherein one or more marking memory cells in the marking memory cell array are in a known memory state, wherein the marking memory cells form a code configured to identify the associated word line of respective one or more marking memory cells in the known memory state, and
- wherein the memory circuit is configured to read, for each of the word lines, at least one memory cell of the one or more memory cells simultaneously with at least one marking memory cell of the one or more marking memory cells, wherein the method comprises:
reading at least one memory cell of the one or more memory cells coupled to a word line of the plurality of word lines simultaneously with at least one marking memory cell of the one or more marking memory cells associated with the word line.

19. The method of claim 18, further comprising:
before the reading one or more memory cells and before the reading one or more of the marking memory cells, writing to the one or more memory cells.

20. The method of claim 18, further comprising:
before the reading one or more memory cells and before the reading one or more of the marking memory cells, erasing the one or more memory cells.

21. The method of claim 18, further comprising:
after the reading one or more memory cells and after the reading one or more of the marking memory cells, checking that data read from the memory cells originate from the one or more memory cells coupled to the word line using information read from the marking memory cells and the code.

* * * * *